US005529957A

United States Patent [19]

Chan

[11] Patent Number: 5,529,957
[45] Date of Patent: Jun. 25, 1996

[54] METHOD FOR BLOCKING CONTAMINATION AND STABILIZING CHIP CAPACITOR DURING ATTACHMENT USING A TAPE STRIP

[75] Inventor: Ken Chan, Chandler, Ariz.

[73] Assignee: VLSI Technology, Inc., San Jose, Calif.

[21] Appl. No.: 417,633

[22] Filed: Apr. 6, 1995

[51] Int. Cl.⁶ .......................... H01L 21/71; H01L 21/764
[52] U.S. Cl. .......................... 437/250; 437/919; 437/974; 148/DIG. 14; 228/189
[58] Field of Search .................................... 257/924, 532; 437/60, 250, 919, 974; 148/DIG. 14; 228/189

[56] References Cited

U.S. PATENT DOCUMENTS 4,880,486  11/1989  Maeda ................................. 156/273.5

Primary Examiner—George Fourson
Assistant Examiner—David E. Graybill
Attorney, Agent, or Firm—Douglas L. Weller

[57] ABSTRACT

Chip capacitors are attached to an integrated circuit package. Strips of synthetic tape are placed between pairs of chip capacitor pads on the integrated circuit package. The strips of synthetic tape each have a height extending above height of the pairs of chip capacitor pads. In the preferred embodiment, the strips of synthetic tape are strips of polyimide tape. The height of the strips of synthetic tape is selected so that the chip capacitors will be installed at a sufficient distance from the integrated circuit package so that solder balls will not be of sufficient diameter to wedge between the integrated circuit package and the chip capacitors. The chip capacitors are installed over the pairs of chip capacitor pads. The chip capacitors rest on the strips of synthetic tape. For example, the chip capacitors are permanently attached to the pairs of chip capacitors using a solder process. A reflow solder process is then performed. Afterwards, the strips of synthetic tape are removed from the integrated circuit package. After removal of the strips of synthetic tape, a cleaning of area under the chip capacitors may be performed to remove any material under and around the chip capacitors.

12 Claims, 10 Drawing Sheets

METHOD FOR BLOCKING CONTAMINATION AND STABILIZING CHIP CAPACITOR DURING ATTACHMENT USING A TAPE STRIP

BACKGROUND

The present invention generally concerns attachment of chip capacitors to integrated circuit packages and particularly to a method for blocking contamination and stabilizing a chip capacitor during attachment.

Chip capacitors are attached to integrated circuit packages, for example, to provide noise filtering to the housed integrated circuits. A solder paste is typically used to attach the chip capacitors. It is not unusual to have, solder balls to be formed during attachment and to become trapped under the chip capacitors.

At times, the trapped solder balls can be dislodged after an integrated circuit is connected to a printed circuit board. It is possible loose "solder balls" can then cause short circuits, having a detrimental effect on the reliability of a finished product.

It is desirable, therefore, to come up with a process which reduces or eliminates the possibility of solder balls or other material being trapped under chip capacitor during attachment.

SUMMARY OF THE INVENTION

In accordance with the preferred embodiment of the present invention, chip capacitors are attached to an integrated circuit package. Strips of synthetic tape are placed between pairs of chip capacitor pads on the integrated circuit package. The strips of synthetic tape each have a height extending above height of the pairs of chip capacitor pads. For example, in the preferred embodiment, the strips of synthetic tape are strips of polyimide tape. The height of the strips of synthetic tape is selected so that the chip capacitors will be installed at a sufficient distance from the integrated circuit package so that solder balls will not be of sufficient diameter to wedge between the integrated circuit package and the chip capacitors.

The chip capacitors are installed over the pairs of chip capacitor pads. The chip capacitors rest on the strips of synthetic tape. For example, the chip capacitors are permanently attached to the pairs of chip capacitor pads using a solder process. A reflow solder process is then performed. Afterwards, the strips of synthetic tape are removed from the integrated circuit package. After removal of the strips of synthetic tape, a general cleaning of area under the chip capacitors may be performed to remove any material under and around the chip capacitors.

The use of synthetic tape strips in the process has several advantages. For example, the synthetic tape strips serve to block the advance of the solder during installation of the chip capacitors. In addition, the synthetic tape strips serve to elevate the chip capacitors high enough so that no undesolved "solder balls" are trapped under the chip capacitors. Another advantage of use of the polyimide tape is that the chip capacitors, supported by the polyimide tape strips, will remain leveled even after solder reflow. The use of polyimide tape also helps to promote proper alignment of the chip capacitors during attachment.

DESCRIPTION OF THE PREFERRED EMBODIMENT

Figure 1:
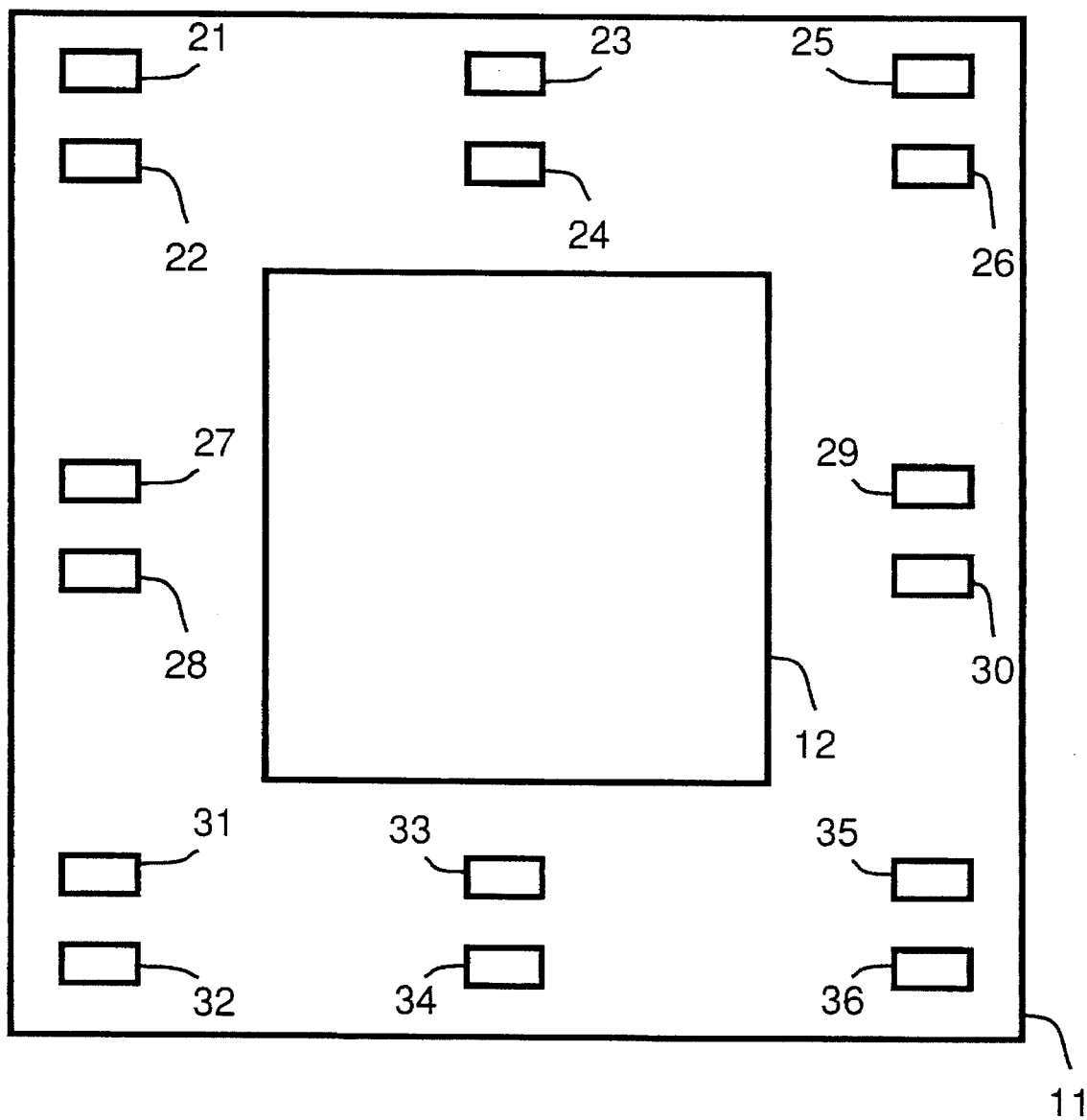
FIG. 1 shows chip capacitor pads placed on an integrated circuit package in accordance with a preferred embodiment of the present invention.

FIG. 1 shows a top view of an integrated circuit package 11. For example, integrated circuit package 11 is a pin gate array with contains a sealed integrated circuit 12. Alternately, integrated circuit package 11 could be a flat pack or another type of integrated circuit package.

On integrated circuit package 11 are various chip capacitor pads on which will be attached chip capacitors. For example, FIG. 1, shows a chip capacitor pad 21, a chip capacitor pad 22, a chip capacitor pad 23, a chip capacitor pad 24, a chip capacitor pad 25, a chip capacitor pad 26, a chip capacitor pad 27, a chip capacitor pad 28, a chip capacitor pad 29, a chip capacitor pad 30, a chip capacitor pad 31, a chip capacitor pad 32, a chip capacitor pad 33, a chip capacitor pad 34, a chip capacitor pad 35 and a chip capacitor pad 36, placed on integrated circuit package 11 as shown.

Figure 2:
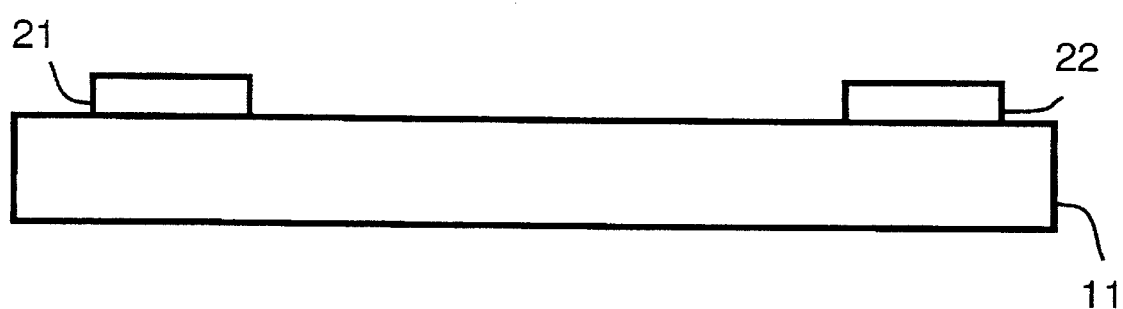
FIG. 2 shows two of the chip capacitor pads placed on the integrated circuit, shown in FIG. 1 in accordance with a preferred embodiment of the present invention.

FIG. 2 shows a side view of chip capacitor pad 21 and chip capacitor 22 placed on a ceramic substrate portion of integrated circuit package 11.

Figure 3:
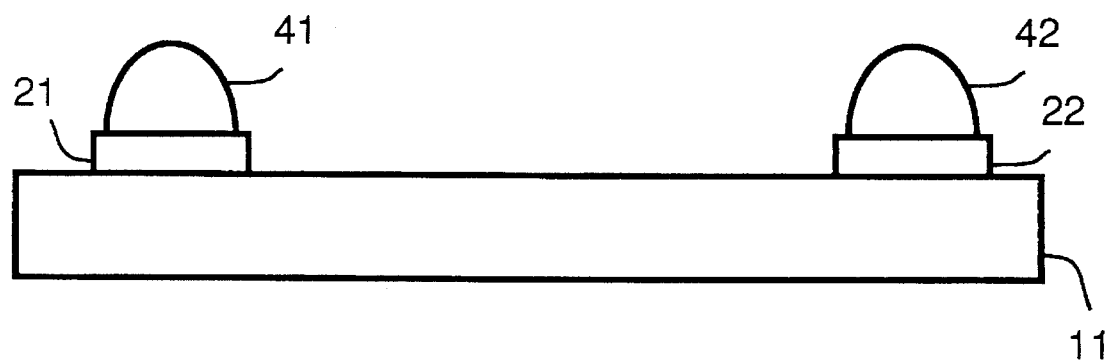
FIG. 3 shows the two chip capacitor pads shown in FIG. 2 with the addition of solder in accordance with a preferred embodiment of the present invention.

In order to attach the chip capacitors, solder paste is placed on each chip capacitor pad. For example, the solder paste is available as part number "HX21AASB88" from Multicore Solder, having a business address of 1751 Jay Ell Drive, Richardson, Tex. For example, as shown in FIG. 3, solder paste 41 is placed on chip capacitor pad 21 and solder paste 42 is placed on chip capacitor pad 22.

Figure 4:
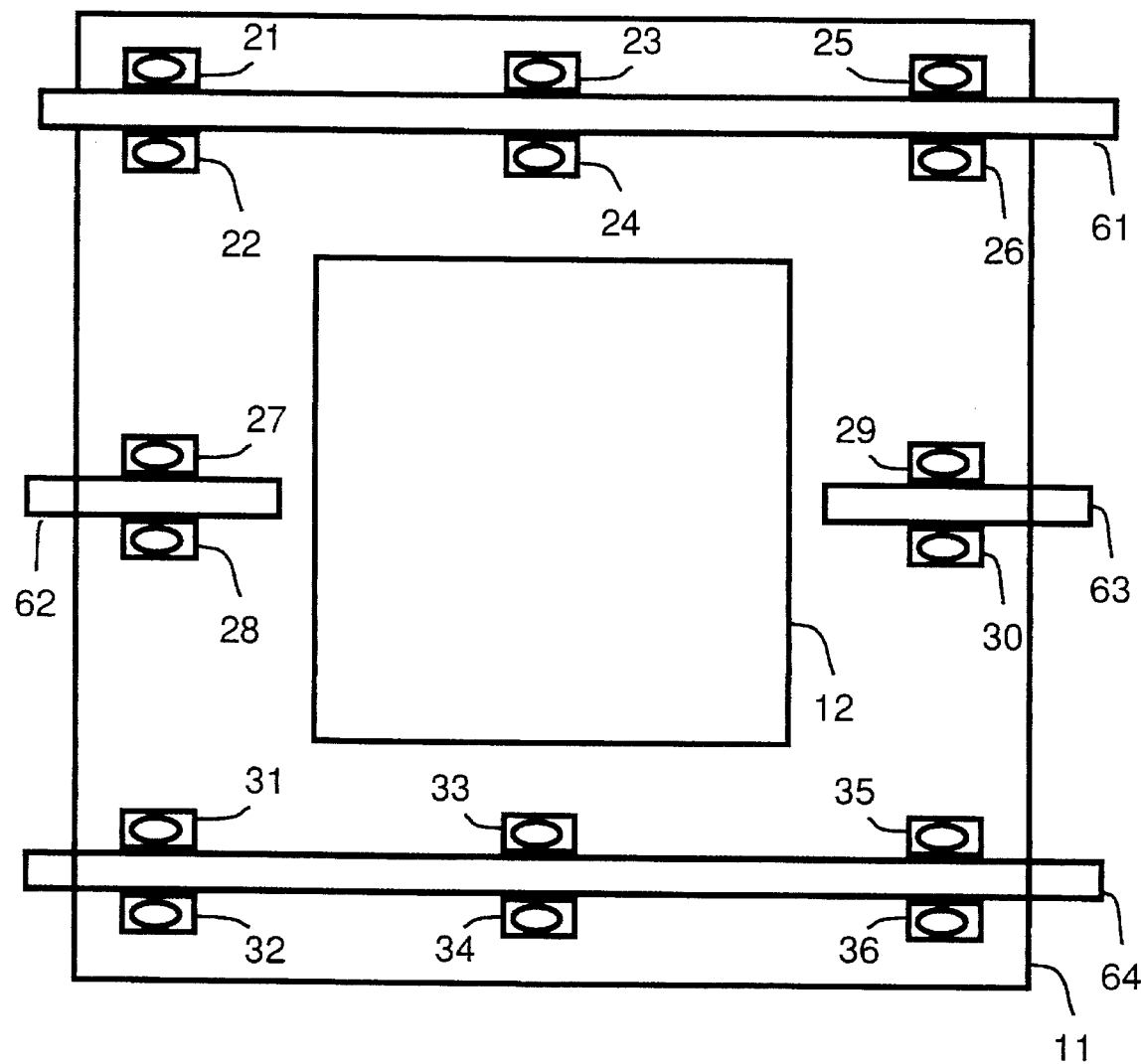
FIG. 4 shows the integrated circuit package shown in FIG. 1 with strips of polyimide tape placed between chip capacitor pads in accordance with a preferred embodiment of the present invention.

Strips of polyimide tape are placed between the chip capacitor pads prior to mounting the chip capacitors. For example, FIG. 4, shows a polyimide tape strip 61, a polyimide tape strip 62, a polyimide tape strip 63 and a polyimide tape strip 64. The polyimide tape strips 61 through 64 serve to block the advance of the solder during installation of the chip capacitors. In addition, polyimide tape strips 61 through 64 serve to elevate the chip capacitors high enough so that no undesolved "solder balls" are trapped under the chip capacitors. Another advantage of use of the polyimide tape is that the chip capacitors, supported by the polyimide tape strips, will remain leveled even after solder reflow. The use of polyimide tape also helps to promote proper alignment of the chip capacitors during attachment.

Figure 5:
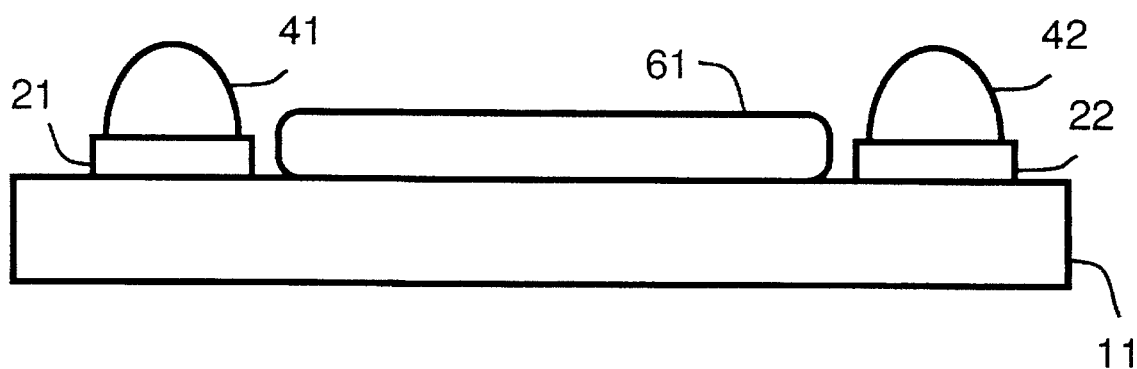
FIG. 5 shows a strip of polyimide tape placed between the two chip capacitor pads shown in FIG. 3 in accordance with a preferred embodiment of the present invention.

The width of the polyimide tape strips depends on the distance between chip capacitor pads. In the preferred embodiment, the width of the polyimide tape is between 90% and 95% of the distance between chip capacitor pads. For example, FIG. 5 shows polyimide tape strip 61 placed between chip capacitor pad 21 and chip capacitor pad 22 (not to scale). Polyimide tape strip 61 takes up roughly 90% to 95% of the distance between chip capacitor pad 21 and chip capacitor pad 22.

The thickness (height) of the polyimide tape is based on the projected size of "solder balls" which will form during the attachment process. For example, in the preferred embodiment, the mean diameter of a solder ball is about 0.0008 inches thick with a standard deviation of about 0.0004 inches. In this case, the polyimide tape has a thickness of 0.004 inches. This selection of polyimide tape thickness makes it an extremely rare occurrence to encounter a solder ball with a thickness sufficient to be wedged under the chip capacitor. For example, polyimide tape is available from Rogers Corporation, having a business address of 100 North Dobson Road, Chandler, Ariz. 85224.

Figure 6:
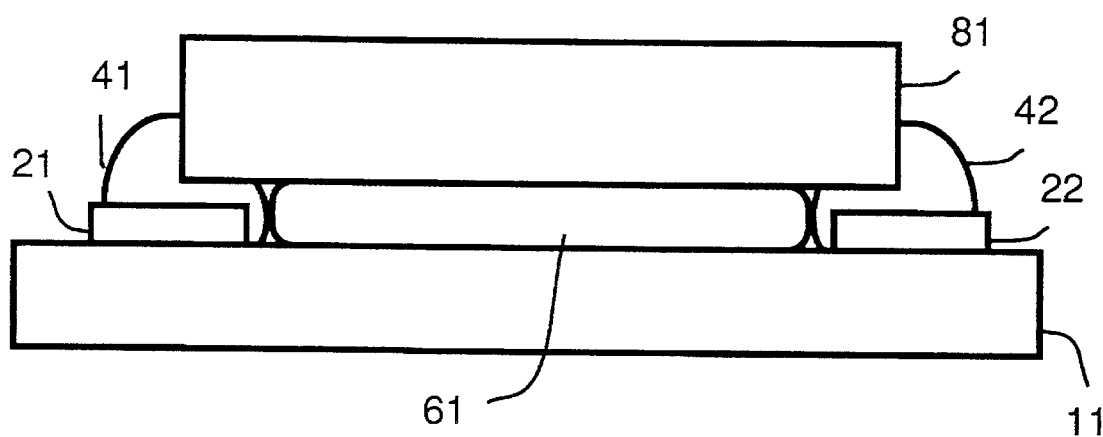
FIG. 6 shows a chip capacitor placed over the polyimide tape shown in FIG. 5 in accordance with a preferred embodiment of the present invention.

FIG. 6 shows a chip capacitor 81 installed over chip capacitor pad 21 and chip capacitor pad 22. Chip capacitor 81 rests on polyimide tape strip 61. As can be seen from FIG. 6, solder paste 41 is squeezed into the gap between chip capacitor pad 21 and polyimide tape strip 61. Likewise, solder paste 42 is squeezed into the gap between chip capacitor pad 22 and polyimide tape strip 61.

Figure 7:
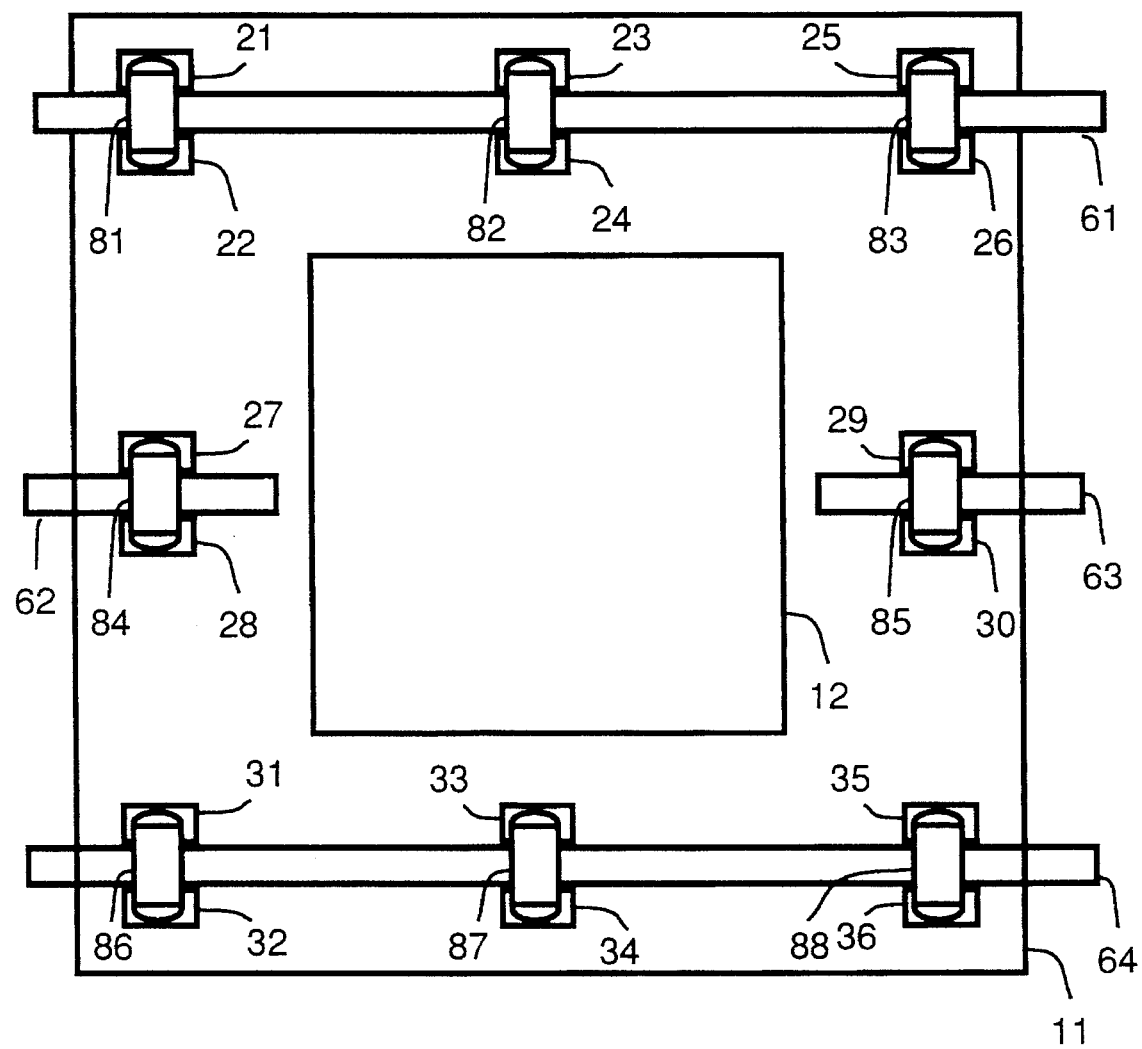
FIG. 7 shows the integrated circuit package shown in FIG. 4 with chip capacitor placed over a strip of polyimide tape in accordance with a preferred embodiment of the present invention.

FIG. 7 shows integrated circuit package 11 with chip capacitor 81 installed over chip capacitor pad 21 and chip capacitor pad 22, a chip capacitor 82 installed over chip capacitor pad 23 and chip capacitor pad 24, a chip capacitor 83 installed over chip capacitor pad 25 and chip capacitor pad 26, a chip capacitor 84 installed over chip capacitor pad 27 and chip capacitor pad 28, a chip capacitor 85 installed over chip capacitor pad 29 and chip capacitor pad 30, a chip capacitor 86 installed over chip capacitor pad 31 and chip capacitor pad 32, a chip capacitor 87 installed over chip capacitor pad 33 and chip capacitor pad 34, and a chip capacitor 88 installed over chip capacitor pad 35 and chip capacitor pad 36.

Figure 8:
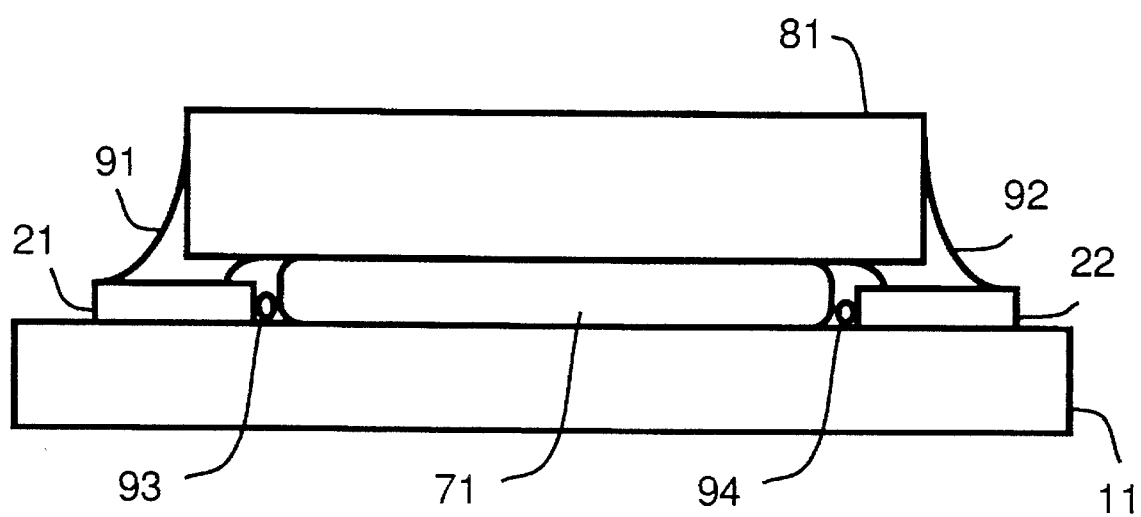
FIG. 8 shows the chip capacitor shown in FIG. 6 after solder reflow in accordance with a preferred embodiment of the present invention.

FIG. 8 shows chip capacitor 81 after reflow solder. The reflow solder resulted in solder fillet 91 being formed from solder paste 41 and solder fillet 92 being formed from solder paste 42. Excess solder balls, illustrated by solder ball 93 and solder ball 94 also may form. As discussed above, polyimide tape strip 21 raises chip capacitor 81 to a sufficient height over the ceramic substrate of integrated circuit package so that it will be extremely rare that a solder ball has a sufficient diameter to be wedged between chip capacitor 81 and the ceramic substrate of integrated circuit package 11.

After the chip capacitors are attached, the polyimide tape strips are removed. Removal is simplified because during cool down after the solder reflow, the polyimide tape strips will shrink a bit. Thus the polyimide tape strips are easily pulled and re-used for other parts.

Figure 9:
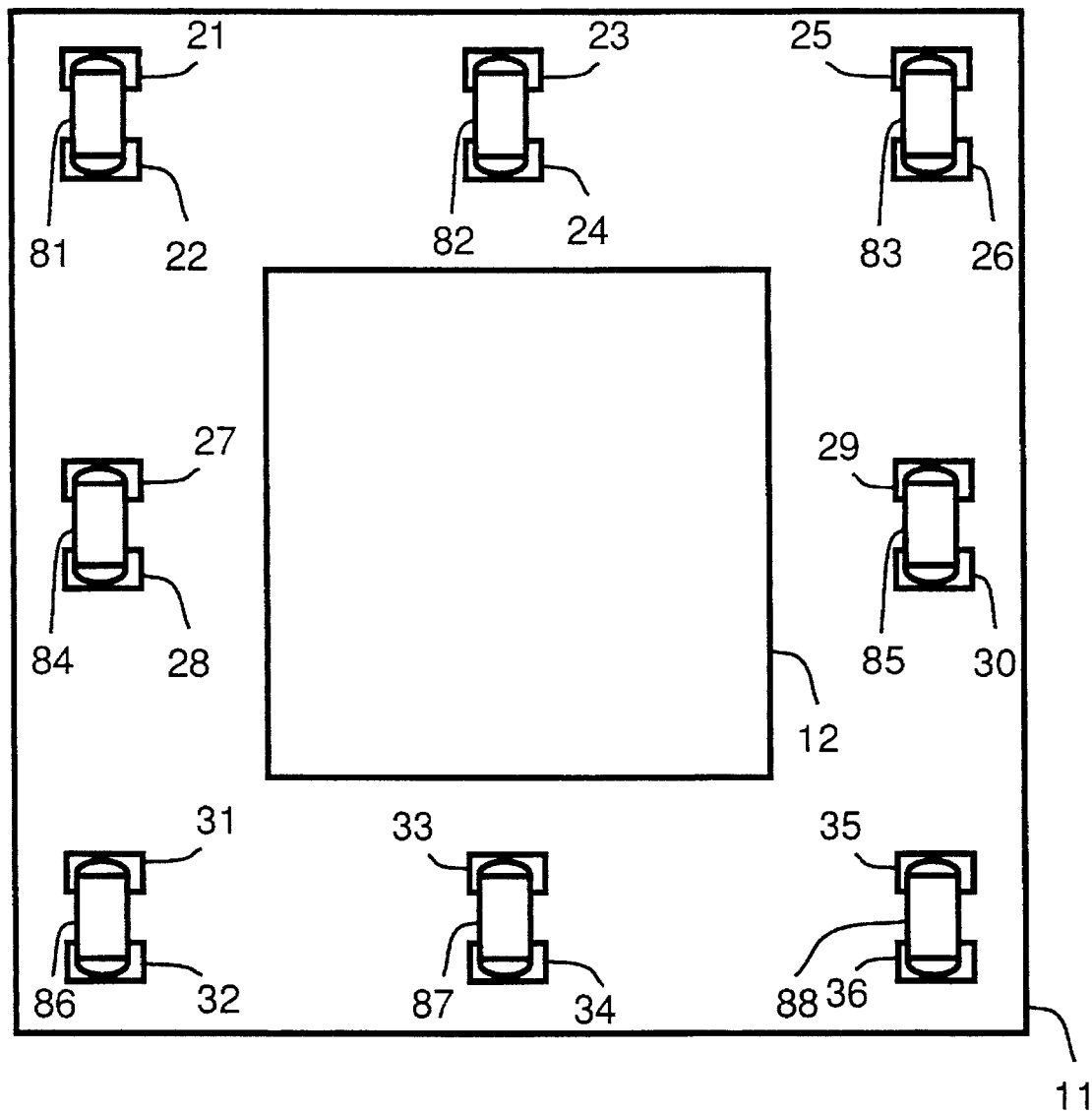
FIG. 9 shows the integrated circuit package shown in FIG. 7 after removal of the strips of polyimide tape in accordance with a preferred embodiment of the present invention.
Figure 10:
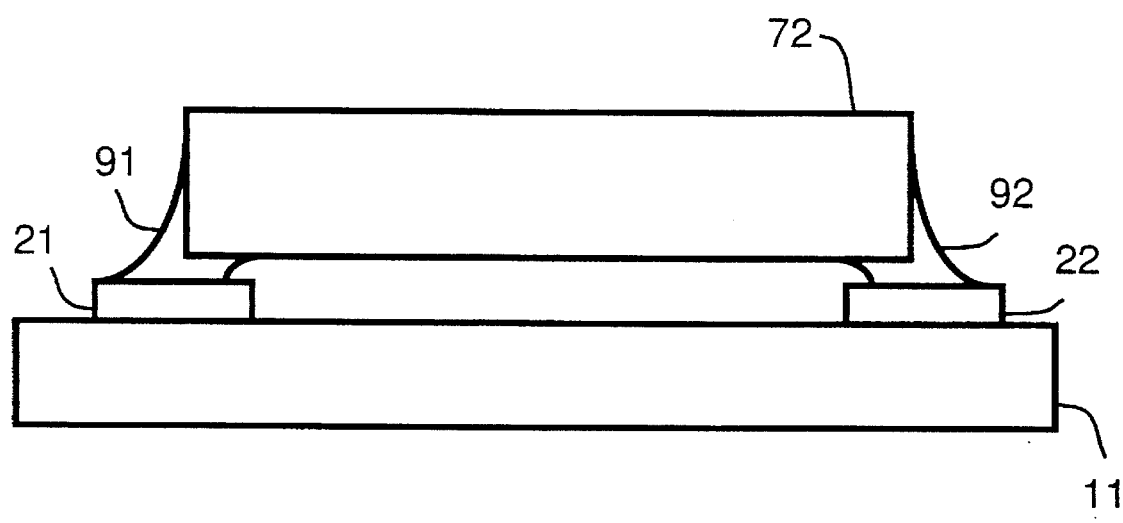
FIG. 10 shows the chip capacitor shown in FIG. 8 after removal of the strip of polyimide tape in accordance with a preferred embodiment of the present invention.

The result is shown in FIG. 9. As shown in FIG. 9, polyimide tape strips 61 through 64 have been removed. As illustrated by FIG. 10, the solder balls, e.g., solder ball 93 and solder ball 94, are removed during the removal of the polyimide tape and by a subsequent cleaning process.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A method for attaching a chip capacitor to an integrated circuit package, comprising the steps of:

(a) placing a strip of synthetic tape between two chip capacitor pads on the integrated circuit package, the strip of synthetic tape having a height extending above a height of the two chip capacitor pads;

(b) installing the chip capacitor over the two chip capacitor pads, the chip capacitor resting on the synthetic tape; and, (c) removing the strip of synthetic tape from the integrated circuit package.

2. A method as in claim 1 wherein in step (a) the strip of synthetic tape is a strip of polyimide tape.

3. A method as in claim 1 wherein step (b) includes the following substep:

(b.1) performing a reflow solder process.

4. A method as in claim 3 additionally comprising the following step performed after step (c):

(d) performing a cleaning of an area under the chip capacitor.

5. A method as in claim 4 additionally comprising the following step performed before step (a):

(e) placing solder paste on the two chip capacitor pads.

6. A method as in claim 1 wherein in step (a) the height of the strip of synthetic tape is selected so that the chip capacitor will be installed at a sufficient distance from the integrated circuit package so that solder balls will not be of sufficient diameter to wedge between the integrated circuit package and the chip capacitor.

7. A method for attaching chip capacitors to an integrated circuit package, comprising the steps of:

(a) placing strips of synthetic tape between pairs of chip capacitor pads on the integrated circuit package, the strips of synthetic tape each having a height extending above a height of the pairs of chip capacitor pads;

(b) installing the chip capacitors over the pairs of chip capacitor pads, the chip capacitors resting on the strips of synthetic tape; and, (c) removing the strips of synthetic tape from the integrated circuit package.

8. A method as in claim 7 wherein in step (a) the strips of synthetic tape are strips of polyimide tape.

9. A method as in claim 7 wherein step (b) includes the following substep:

(b.1) performing a reflow solder process.

10. A method as in claim 9 additionally comprising the following step performed after step (c):

(d) performing a cleaning of an area under the chip capacitors.

11. A method as in claim 10 additionally comprising the following step performed before step (a):

(e) placing solder paste on the pairs of chip capacitor pads.

12. A method as in claim 7 wherein in step (a) the height of the strips of synthetic tape is selected so that the chip capacitors will be installed at a sufficient distance from the integrated circuit package so that solder balls will not be of sufficient diameter to wedge between the integrated circuit package and the chip capacitors.

* * * * *